United States Patent
Reznicek et al.

(10) Patent No.: US 10,916,629 B2
(45) Date of Patent: Feb. 9, 2021

(54) NANOSHEET-CMOS EPROM DEVICE WITH EPITAXIAL OXIDE CHARGE STORAGE REGION

(71) Applicant: International Business Machines Corporation, Armonk, NY (US)

(72) Inventors: Alexander Reznicek, Troy, NY (US); Jeng-Bang Yau, Yorktown Heights, NY (US); Tak H. Ning, Yorktown Heights, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/050,810

(22) Filed: Jul. 31, 2018

(65) Prior Publication Data

US 2020/0044028 A1 Feb. 6, 2020

(51) Int. Cl.
| | | |
|---|---|---|
| *H01L 29/10* | (2006.01) | |
| *H01L 21/8238* | (2006.01) | |
| *H01L 29/792* | (2006.01) | |
| *H01L 27/11568* | (2017.01) | |
| *H01L 29/66* | (2006.01) | |
| *H01L 27/092* | (2006.01) | |
| *H01L 29/06* | (2006.01) | |

(52) U.S. Cl.
CPC .. *H01L 29/1029* (2013.01); *H01L 21/823814* (2013.01); *H01L 21/823821* (2013.01); *H01L 27/0924* (2013.01); *H01L 27/11568* (2013.01); *H01L 29/0673* (2013.01); *H01L 29/66545* (2013.01); *H01L 29/66553* (2013.01); *H01L 29/792* (2013.01)

(58) Field of Classification Search
CPC ... H01L 27/0922–0924; H01L 29/0673; H01L 29/068
See application file for complete search history.

(56) References Cited

U.S. PATENT DOCUMENTS

| | | |
|---|---|---|
| 6,610,548 B1 | 4/2003 | Ami et al. |
| 6,630,383 B1 | 10/2003 | Ibok et al. |
| 6,852,575 B2 | 2/2005 | Bojarczuk, Jr. et al. |
| 7,135,699 B1 | 11/2006 | Atanackovic |
| 7,183,606 B2 | 2/2007 | Wang et al. |
| 7,700,993 B2 | 4/2010 | Cai et al. |
| 8,705,280 B2 | 4/2014 | Cai et al. |

(Continued)

OTHER PUBLICATIONS

Shi, R., et al, "Nb-Doped La2O3 as Charge-Trapping Layer for Nonvolatile Memory Applications", IEEE Transactions on Device and Materials Reliability, Mar. 2015, pp. 123-126, vol. 15, No. 1.

(Continued)

*Primary Examiner* — Stephen M Bradley
(74) *Attorney, Agent, or Firm* — Scully, Scott, Murphy & Presser, P.C.; L. Jeffrey Kelly, Esq.

(57) ABSTRACT

A semiconductor structure that occupies only one areal device area is provided that includes a charge storage region sandwiched between a pFET nanosheet device and an nFET nanosheet device. The charge storage region is an epitaxial oxide nanosheet that is lattice matched to an underlying first silicon channel material nanosheet and an overlying second silicon channel material nanosheet. The semiconductor structure can be used as an EPROM device.

9 Claims, 11 Drawing Sheets

(56) References Cited

U.S. PATENT DOCUMENTS

| | | | |
|---|---|---|---|
| 9,224,811 B2* | 12/2015 | Cheng | H01L 29/0673 |
| 9,472,558 B1* | 10/2016 | Cheng | H01L 27/1116 |
| 9,659,655 B1 | 5/2017 | Chan et al. | |
| 9,881,930 B1 | 1/2018 | Leobandung | |
| 2016/0043074 A1* | 2/2016 | Hurley et al. | H01L 27/0688 |
| 2016/0204228 A1* | 6/2016 | Tapily et al. | H01L 29/66772 |
| 2016/0322478 A1 | 11/2016 | Hu | |
| 2018/0019255 A1 | 1/2018 | Hopkins et al. | |
| 2018/0374753 A1* | 12/2018 | Pawlak et al. | H01L 21/823431 |

OTHER PUBLICATIONS

Tao, Q. B., "Mo-Doped La2O3 as Charge-Trapping Layer for Improved Low-Voltage Flash-Memory Performance", ECS Solid State Letters, Published Aug. 31, 2013, pp. Q87-Q89, 2 (11).

* cited by examiner

NANOSHEET-CMOS EPROM DEVICE WITH EPITAXIAL OXIDE CHARGE STORAGE REGION

BACKGROUND

The present application relates to a semiconductor structure and a method of forming the same. More particularly, the present application relates to a semiconductor structure including a charge storage region that is sandwiched between a pFET nanosheet device and an nFET nanosheet device.

The use of non-planar semiconductor devices such as, for example, nanosheet containing devices has been touted as a viable option for the 5 nm or beyond technology node. By "nanosheet containing device" it is meant that the device contains one or more layers of semiconductor channel material portions having a vertical thickness that is substantially less than its width. Nanosheet formation relies on the selective removal of one semiconductor material relative to another semiconductor material to form suspended nanosheets for gate-all-around devices. There is a need for providing memory devices such as, for example, an electrically programmable read only (EPROM), using nanosheet technology.

SUMMARY

A semiconductor structure that occupies only one areal device area is provided that includes a charge storage region sandwiched between a pFET nanosheet device and an nFET nanosheet device. The charge storage region is an epitaxial oxide nanosheet that is lattice matched to an underlying first silicon channel material nanosheet and an overlying second silicon channel material nanosheet. The semiconductor structure can be used as an EPROM device.

In one aspect of the present application, a semiconductor structure is provided. In one embodiment, the semiconductor structure includes a nanosheet stack comprising an epitaxial oxide nanosheet sandwiched between a first silicon channel material nanosheet and a second silicon channel material nanosheet, and suspended above a semiconductor substrate. A first field effect transistor of a first conductivity type is located beneath the first silicon channel material nanosheet, and a second field effect transistor of a second conductivity type, opposite the first conductivity type, is located above the second silicon channel material nanosheet.

In another aspect of the present application, a method of forming a semiconductor structure is provided. In one embodiment, the method includes forming a nanosheet material stack of, and from bottom to top, a sacrificial semiconductor material nanosheet, a first silicon channel material nanosheet, an epitaxial oxide nanosheet, and a second silicon channel material nanosheet on a surface of a semiconductor substrate and beneath a sacrificial gate structure and a dielectric spacer material layer. The sacrificial semiconductor material nanosheet is recessed to provide a gap between the first silicon channel material nanosheet and the semiconductor substrate. An inner dielectric spacer is then formed in the gap and contacting a sidewall of the recessed sacrificial semiconductor channel material nanosheet. A first source/drain structure is formed on each side of the nanosheet material stack and contacting a sidewall of the first silicon channel material nanosheet, and a second source/drain structure is formed above the first source/drain structure and on each side of the nanosheet material stack. The second source/drain structure contacts a sidewall of the second silicon channel material nanosheet. The sacrificial gate structure and the recessed sacrificial semiconductor material nanosheet are removed to provide a gate cavity containing an upper gate cavity portion located above the second silicon channel material nanosheet, and a lower gate cavity portion located beneath the first silicon channel material nanosheet. A first functional gate structure of a first conductivity type is formed beneath the first silicon channel material nanosheet and in the lower gate cavity portion, and a second functional gate structure of a second conductivity type that is opposite from the first conductivity type is formed above the second silicon channel material nano sheet and in the upper gate cavity portion.

DETAILED DESCRIPTION

Figure 1:
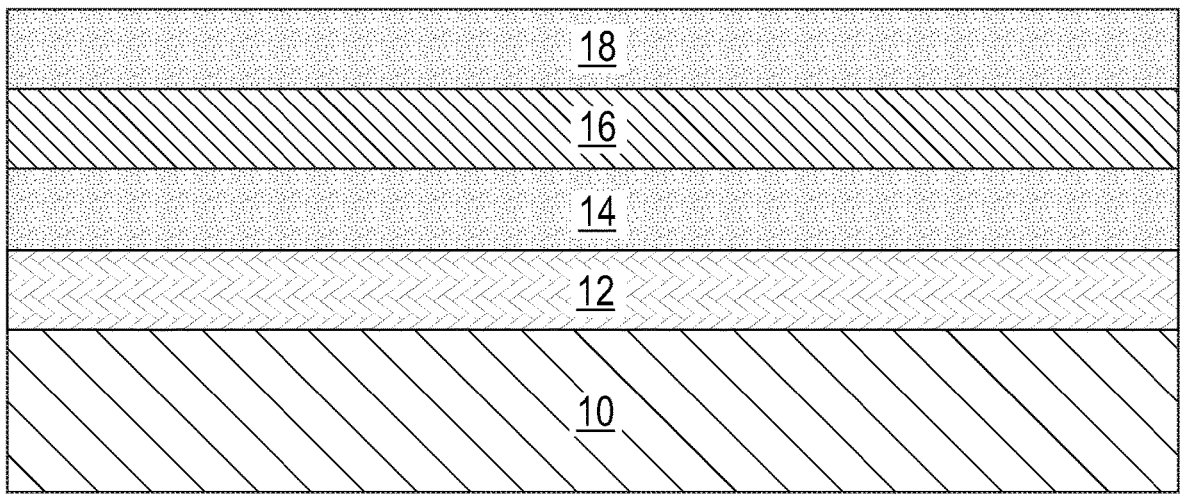
FIG. 1 is a cross sectional view of an exemplary semiconductor structure of the present application and during an early stage of fabrication, the exemplary structure including a material stack structure of, and from bottom to top, a sacrificial semiconductor material layer, a first silicon channel material layer, an epitaxial oxide layer, and a second silicon channel material layer located on a surface of a semiconductor substrate.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure of the present application and during an early stage of fabrication, the exemplary structure including a material stack structure of, and from bottom to top, a sacrificial semiconductor material layer 12, a first silicon channel material layer 14, an epitaxial oxide layer 16, and a second silicon channel material layer 18 located on a surface of a semiconductor substrate 10. In accordance with the present application, the first silicon channel material layer 14, the epitaxial oxide layer 16, and the second silicon channel material layer 18 of the material stack structure are lattice matched.

The semiconductor substrate 10 that can be employed in the present application includes at least one semiconductor material that has semiconducting properties. Examples of semiconductor materials that can be used as the semiconductor substrate 10 include, for example, silicon (Si), a silicon germanium (SiGe) alloy, a silicon germanium carbide (SiGeC) alloy, germanium (Ge), III/V compound semiconductors or II/VI compound semiconductors. In one embodiment, the semiconductor substrate 10 is a bulk semiconductor substrate. The term "bulk semiconductor substrate" denotes a substrate that is composed entirely of one or more semiconductor materials. In one example, the bulk semiconductor substrate is composed entirely of Si.

In some embodiments, the semiconductor substrate 10 is composed of a semiconductor-on-insulator (SOI) substrate. A SOI substrate typically includes a handle substrate, an insulator layer and a topmost semiconductor material layer. In some embodiments, the handle substrate of the SOI substrate may include a semiconductor material, as described above. In other embodiments, the handle substrate may be omitted, or the handle substrate may be composed of a conductive material and/or an insulator material. The insulator layer of the SOI substrate may include a crystalline or non-crystalline dielectric material. In one example, the insulator layer of the SOI substrate may be composed of silicon dioxide and/or boron nitride. The topmost semiconductor layer of the SOI substrate is composed of a semiconductor material, as defined above.

The material stack structure (12, 14, 16, 18), as defined above, is then formed on the semiconductor substrate 10. As mentioned above, the material stack structure includes a sacrificial semiconductor material layer 12, a first silicon channel material layer 14, an epitaxial oxide layer 16, and a second silicon channel material layer 18 stacked one atop the other.

The sacrificial semiconductor material layer 12 is composed of a semiconductor material which differs in composition from at least an upper portion of the semiconductor substrate 10 an is other than silicon. In one embodiment, the sacrificial semiconductor material layer 12 is composed of a silicon germanium alloy. The sacrificial semiconductor material layer 12 can be formed utilizing an epitaxial growth (or deposition process) as defined in greater detail herein below.

The first and second silicon channel material layers 14 and 18 have a different etch rate than the sacrificial semiconductor material layer 12. The first and second silicon channel material layers 14 and 18 can be formed utilizing an epitaxial growth (or deposition process) as defined in greater detail herein below.

The epitaxial oxide layer 16, which is sandwiched between the first silicon channel material layer 14 and the second silicon channel material layer 18, may be selected to have a lattice dimension substantially similar (i.e., ±5%) to the lattice dimension of the first and second silicon channel material layers (14, 16), thus the epitaxial oxide layer 16 is said to be lattice matched to the first and second silicon channel material layers (14, 18). The epitaxial oxide layer 16 is epitaxially deposited, as defined below. Examples of epitaxial oxides that are suitable for use as the epitaxial oxide layer 16 may include binary oxides, such as, e.g., lanthanum (II) oxide ($La_2O_3$) gadolinium(III)-oxide ($Gd_2O_3$), dysprosium(III)-oxide ($Dy_2O_3$), holmium(III) oxide ($Ho_2O_3$), erbium (III) oxide ($Er_2O_3$), thulium (III) oxide ($Tm_2O_3$), lutetium(III) oxide ($Lu_2O_3$) or cerium (IV) oxide ($CeO_2$), ternary oxides including a rare earth metal, such as e.g., Gd, Er, Nd, La and Y forming oxides such as, e.g., lanthanum-yttrium oxide (($La_xY_{1-x})_2O_3$), gadolinium-erbium oxide (($Gd_xEr_{1-x})_2O_3$), neodymium-erbium oxide (($Nd_xEr_{1-x})_2O_3$), neodymium-gadolinium oxide (($Nd_xGd_{1-x})_2O_3$), lanthanum-erbium oxide (($La_xEr_{1-x})_2O_3$), or any combination thereof. In one embodiment, the epitaxial oxide layer 16 is composed of ($La_xY_{1-x})_2O_3$ alloy in which x is 0.33.

The thickness of the epitaxial oxide layer 16 can be determined by satisfying the requirement of negligible loss of stored charge by tunneling into the first and second silicon channel material layers 14 and 18. The tunneling between a silicon channel material layer and the epitaxial oxide layer 16 can be described by the Fowler-Nordheim model. According to this model, and to keep the tunneling current below a desired level, e.g., $1E^{-8}$ Amperes/cm$^2$, the epitaxial oxide field must be lower than about 6 MV/cm. In the present application, the thickness of the epitaxial oxide layer 16 is from 10 nm to 500 nm. In some embodiments, the thickness of the epitaxial oxide layer 16 is from 10 nm to 100 nm, while in other embodiments the thickness of the epitaxial oxide layer 16 is from 10 nm to 50 nm.

Material stack structure (12, 14, 16, 18) can be formed by sequential epitaxial growth of the sacrificial semiconductor material layer 12, the first silicon channel material layer 14, the epitaxial oxide layer 16, and the second silicon channel material layer 18. Following epitaxial growth of the second silicon channel material layer 18, a patterning process may be used to provide the material stack structure (12, 14, 16, 18) shown in FIG. 1. Patterning may be performed by lithography and etching or any other patterning method known to those skilled in the art including, for example, a sidewall-image transfer (SIT) process.

The terms "epitaxially growing and/or depositing" and "epitaxially grown and/or deposited" mean the growth of a material (e.g., semiconductor material or epitaxial oxide) on a growth surface of another material, in which the material being grown has the same crystalline characteristics as the material of the growth surface. In an epitaxial deposition process, the chemical reactants provided by the source gases are controlled and the system parameters are set so that the depositing atoms arrive at the growth surface of a material with sufficient energy to move around on the growth surface and orient themselves to the crystal arrangement of the atoms of the growth surface. Therefore, an epitaxial material has the same crystalline characteristics as the growth on surface on which it is formed.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth of the various material layers (i.e., the sacrificial semiconductor material layer 12, the first silicon channel material layer 14, the epitaxial oxide layer 16 and the second silicon channel material layer 18) can be performed utilizing any well known precursor gas or gas mixture. Carrier gases like hydrogen, nitrogen, helium and argon can be used.

The term "material stack structure" denotes a continuous structure including a pair of vertical sidewalls that are parallel to each other. As used herein, a surface is "vertical" if there exists a vertical plane from which the surface does not deviate by more than three times the root mean square roughness of the surface. Each layer within the material stack structure (i.e., the sacrificial semiconductor material layer 12, the first silicon channel material layer 14, the epitaxial oxide layer 16 and the second silicon channel material layer 18) may have a thickness from 5 nm to 12 nm. The thickness of each layer within the material stack structure may be the same or different.

Figure 2:
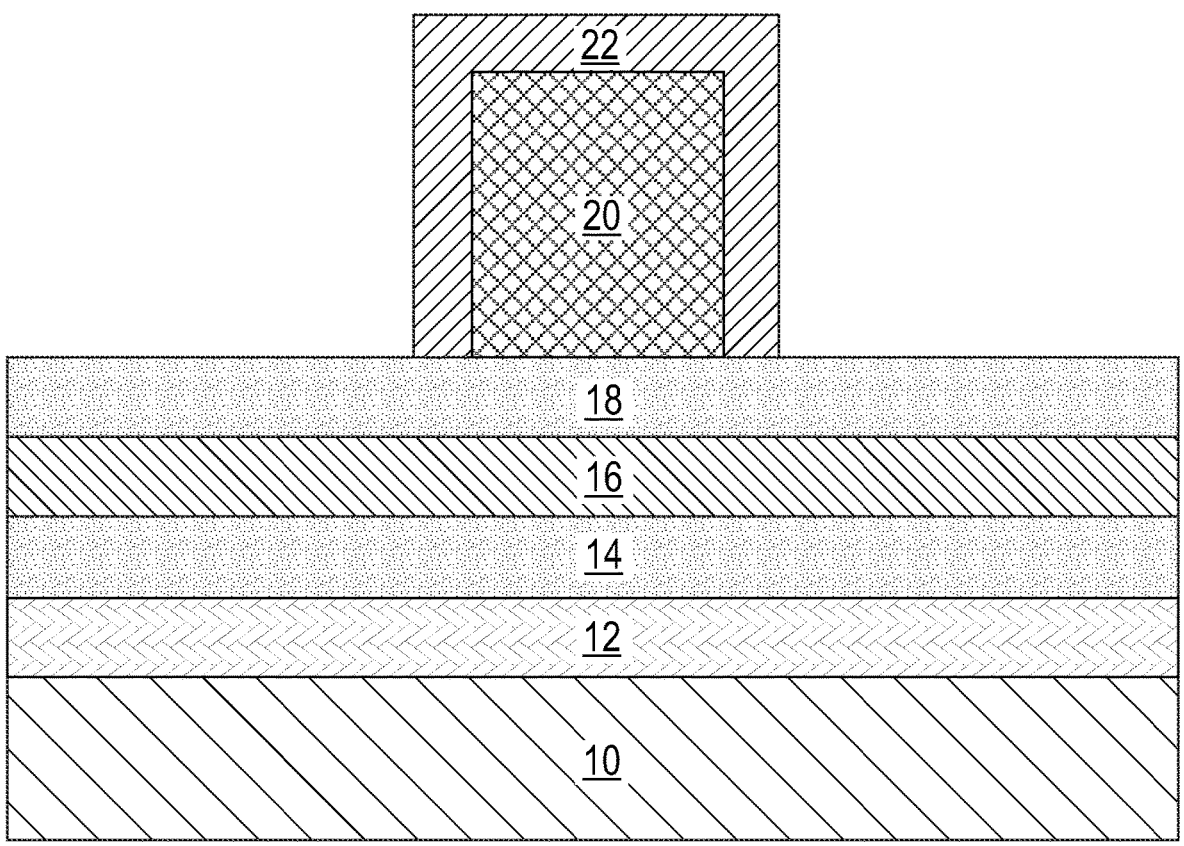
FIG. 2 is a cross sectional view of the exemplary semiconductor structure of FIG. 1 after forming a sacrificial gate structure and a dielectric spacer material layer on a surface of the material stack structure.

Referring now to FIG. 2, there is illustrated the exemplary semiconductor structure of FIG. 1 after forming a sacrificial gate structure 20 and a dielectric spacer material layer 22 on a surface of the material stack structure (12, 14, 16, 18). The sacrificial gate structure 20 is located on a first side and a second side of the material stack structure, and spans across a topmost surface of a portion of the material stack structure. The sacrificial gate stack 20 thus straddles over a portion of the material stack structure. A dielectric spacer material layer 22 is present on the exposed surfaces of the sacrificial gate structure 20.

The sacrificial gate structure 20 may include a single sacrificial material or a stack of two or more sacrificial materials (i.e., the sacrificial gate structure 20 includes at least one sacrificial material). In one embodiment, the at least one sacrificial material comprises, from bottom to top, a sacrificial gate dielectric material, a sacrificial gate material and a sacrificial dielectric cap. In some embodiments, the sacrificial gate dielectric material and/or the sacrificial dielectric cap can be omitted and only a sacrificial gate material is formed. The at least one sacrificial material can be formed by forming a blanket layer (or layers) of a material (or various materials) and then patterning the material (or various materials) by lithography and an etch. In one embodiment, the at least one sacrificial material can be formed by first depositing a blanket layer of a sacrificial gate dielectric material. The sacrificial gate dielectric material can be an oxide, nitride, and/or oxynitride. In one example, the sacrificial gate dielectric material can be a high k material having a dielectric constant greater than silicon dioxide. In some embodiments, a multilayered dielectric structure comprising different dielectric materials, e.g., silicon dioxide, and a high k dielectric can be formed and used as the sacrificial gate dielectric material. The sacrificial gate dielectric material can be formed by any deposition technique including, for example, chemical vapor deposition (CVD), plasma enhanced chemical vapor deposition (PECVD), physical vapor deposition (PVD), sputtering, or atomic layer deposition.

After forming the blanket layer of sacrificial gate dielectric material, a blanket layer of a sacrificial gate material can be formed on the blanket layer of sacrificial gate dielectric material. The sacrificial gate material can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

After forming the blanket layer of sacrificial gate material, a blanket layer of a sacrificial gate cap material can be formed. The sacrificial gate cap material may include a hard mask material such as, for example, silicon dioxide and/or silicon nitride. The sacrificial gate cap material can be formed by any suitable deposition process such as, for example, chemical vapor deposition or plasma enhanced chemical vapor deposition.

After providing the above mentioned sacrificial material stack (or any subset of the sacrificial materials), lithography and etching can be used to pattern the sacrificial material stack (or any subset of the sacrificial materials) and to provide the sacrificial gate structure 20.

The dielectric spacer material layer 22 can be formed by deposition of a dielectric spacer material and then etching the dielectric spacer material. One example of a dielectric spacer material that may be employed in the present application is silicon nitride. The deposition process that can be employed in providing the dielectric spacer material includes, for example, chemical vapor deposition (CVD), plasma enhanced chemical vapor deposition (PECVD), or physical vapor deposition (PVD). The etch used to etch the deposited dielectric spacer material may comprise a dry etching process such as, for example, reactive ion etching.

Figure 3:
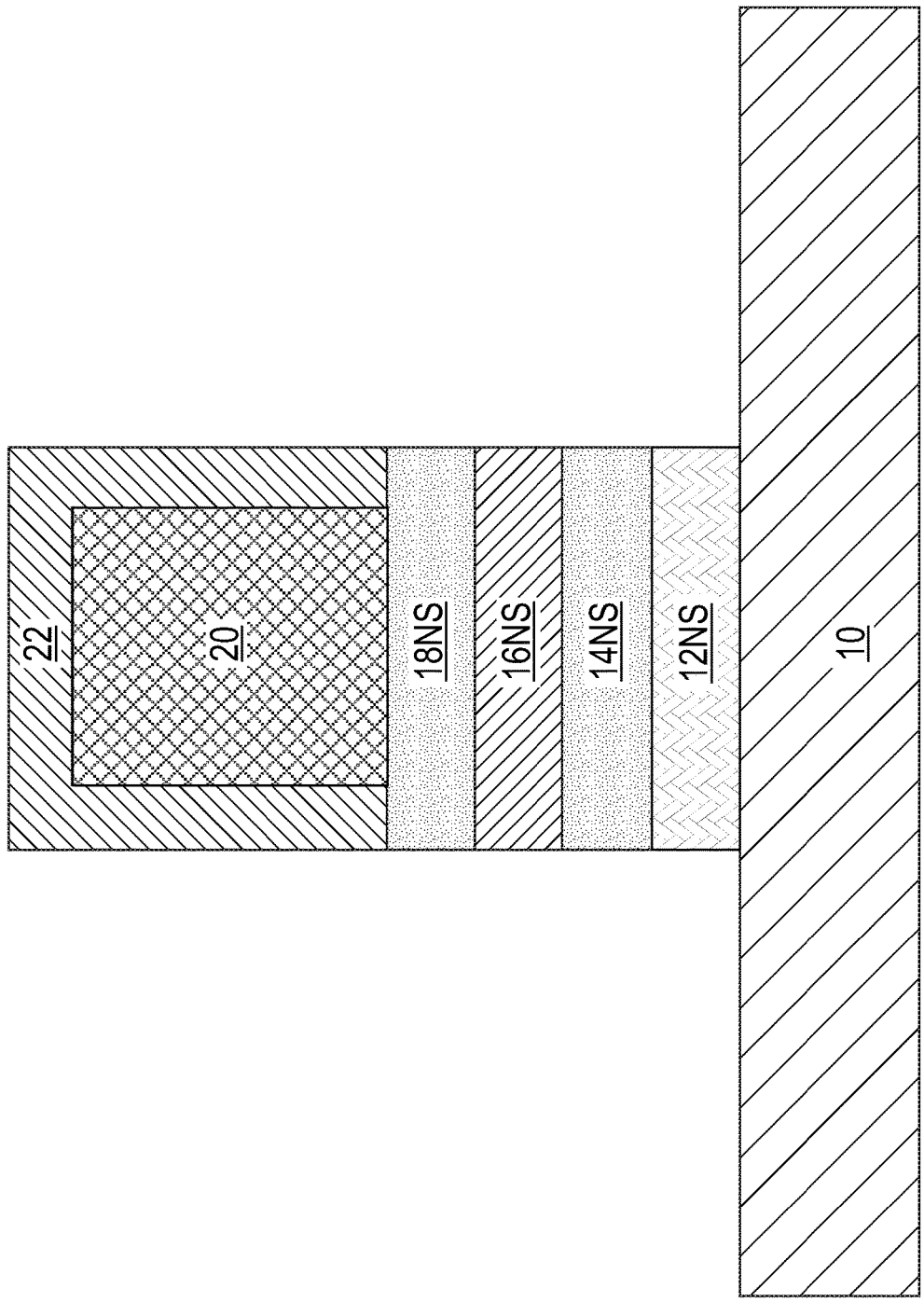
FIG. 3 is a cross sectional view of the exemplary semiconductor structure of FIG. 2 after removing physically exposed portions of the material stack structure that are not protected by sacrificial gate structure and the dielectric spacer material layer to provide a nanosheet material stack of, and from bottom to top, a sacrificial semiconductor material nanosheet, a first silicon channel material nanosheet, an epitaxial oxide nanosheet, and a second silicon channel material nanosheet located beneath the sacrificial gate structure and the dielectric spacer material layer.

Referring now to FIG. 3, there is illustrated the exemplary semiconductor structure of FIG. 2 after removing physically exposed portions of the material stack structure (12, 14, 16, 18) that are not protected by sacrificial gate structure 20 and the dielectric spacer material layer 22 to provide a nanosheet material stack of, and from bottom to top, a sacrificial semiconductor material nanosheet 12NS, a first silicon channel material nanosheet 14NS, an epitaxial oxide nanosheet 16NS, and a second silicon channel material nanosheet 18NS located beneath the sacrificial gate structure 20 and the dielectric spacer material layer 22. The sacrificial semiconductor material nanosheet 12NS, the first silicon channel material nanosheet 14NS, the epitaxial oxide nanosheet 16NS, and the second silicon channel material nanosheet 18NS represent non-removed material layer portions of the material stack structure (12, 14, 16, 18).

The removal of the physically exposed portions of the material stack structure (12, 14, 16, 18) not covered by the sacrificial gate structure 20 and the dielectric spacer material layer 22 can be performed utilizing an anisotropic etching process such as, for example, reactive ion etching (RIE). A portion of the material stack structure (12, 14, 16, 18) remains beneath the sacrificial gate structure 20 and the dielectric spacer material layer 22. The remaining portion of the material stack structure (12, 14, 16, 18) that is presented beneath the sacrificial gate structure 20 and the dielectric spacer material layer 22 can be referred to as a nanosheet material stack. As stated above, the nanosheet material stack structure includes a sacrificial semiconductor material nanosheet 12NS, a first silicon channel material nanosheet 14NS, an epitaxial oxide nanosheet 16NS, and a second silicon channel material nanosheet 18NS.

Each nanosheet, i.e., the sacrificial semiconductor material nanosheet 12NS, the first silicon channel material nanosheet 14NS, the epitaxial oxide nanosheet 16NS, and the second silicon channel material nanosheet 18NS, that constitutes the nanosheet material stack has a thickness as mentioned above for the individual layers of the material stack, and a width from 30 nm to 200 nm. At this point of the present application and as illustrated in FIG. 3, the sidewalls of the nanosheets (i.e., the sacrificial semiconductor material nanosheet 12NS, the first silicon channel material nanosheet 14NS, the epitaxial oxide nanosheet 16NS, and the second silicon channel material nanosheet 18NS) are vertically aligned to each other as well as to an outmost sidewall of the dielectric spacer material layer 22.

Figure 4:
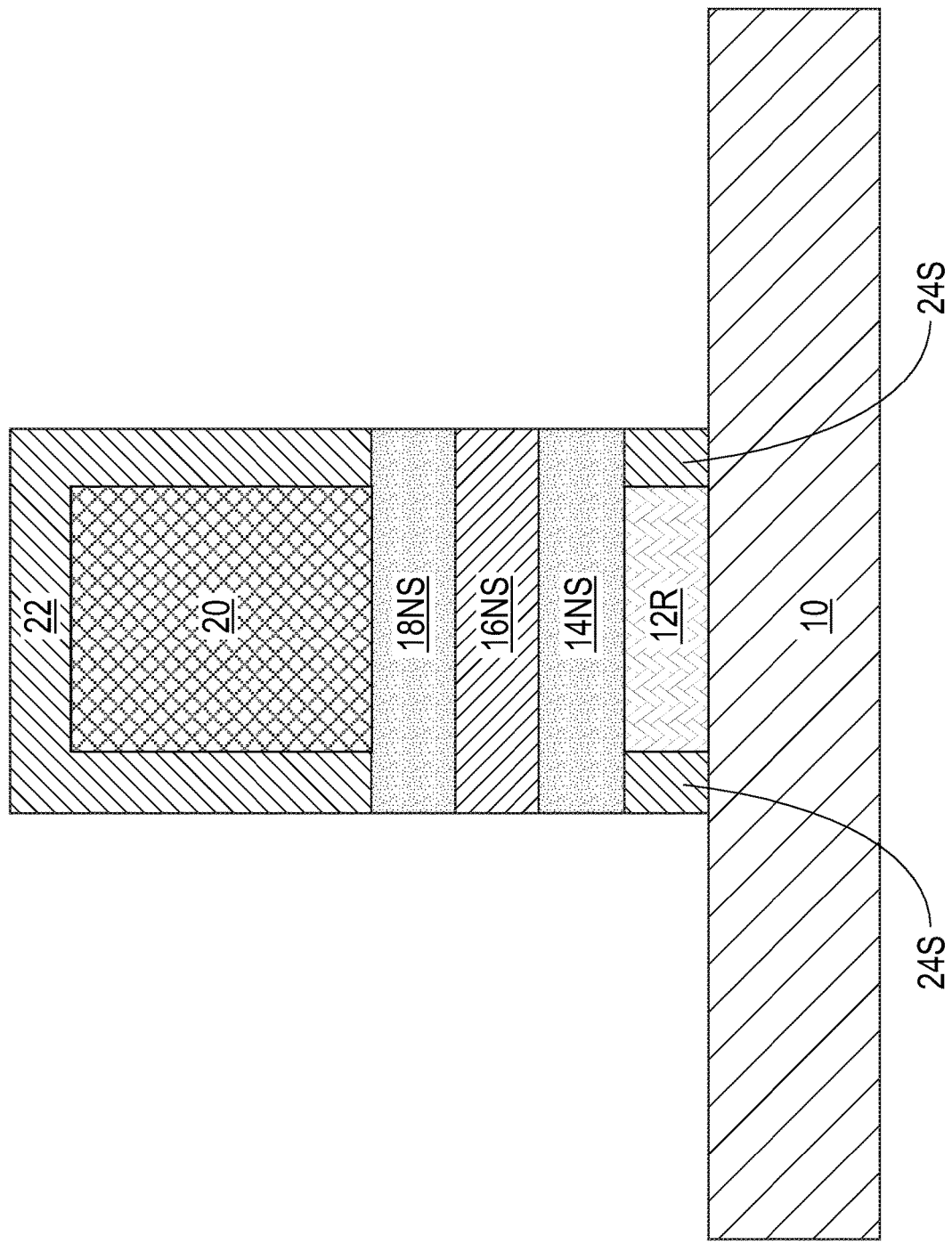
FIG. 4 is a cross sectional view of the exemplary semiconductor structure of FIG. 3 after recessing the sacrificial semiconductor material nanosheet and forming an inner dielectric spacer on exposed sidewalls of the recessed sacrificial semiconductor material nanosheet.

Referring now to FIG. 4, there is illustrated the exemplary semiconductor structure of FIG. 3 after recessing the sacrificial semiconductor material nanosheet 12NS and forming an inner dielectric spacer 24S on exposed sidewalls of the recessed sacrificial semiconductor material nanosheet 12R. The recessed sacrificial semiconductor material nanosheet is designated as element 12R in the drawings of the present application. The recessed sacrificial semiconductor material nanosheet 12R has a width that is less than the original width of the sacrificial semiconductor material nanosheet 12NS. The recessing of the sacrificial semiconductor material nanosheet 12NS provides a gap (not specifically shown) between the first silicon channel material nanosheet 14NS and the semiconductor substrate 10. The recessing of the sacrificial semiconductor material nanosheet 12NS may be performed utilizing a lateral etching process that is selective in removing physically exposed end portions of the sacrificial semiconductor material nanosheet 12NS relative to the first and second silicon channel material nanosheet (14NS, 18NS), and the epitaxial oxide nanosheet 16NS.

The inner dielectric spacer 24S is formed in the gap that is formed by the recessing of the sacrificial semiconductor material nanosheet 12NS. The inner dielectric spacer 24S is formed by deposition of a dielectric spacer material and etching the deposited dielectric spacer material. The dielectric spacer material that provides the inner dielectric spacer 24S may be the same as, or different from, the dielectric spacer material that provides the dielectric spacer material layer 22. As is shown, the inner dielectric spacer 24S has an innermost sidewall that directly contacts a sidewall of the recessed sacrificial semiconductor material nanosheet, and an outermost sidewall that is vertically aligned with the sidewalls of the first and second silicon channel material nanosheets (14NS, 18NS), the epitaxial oxide nanosheet 16NS, and the dielectric spacer material layer 22.

Figure 5:
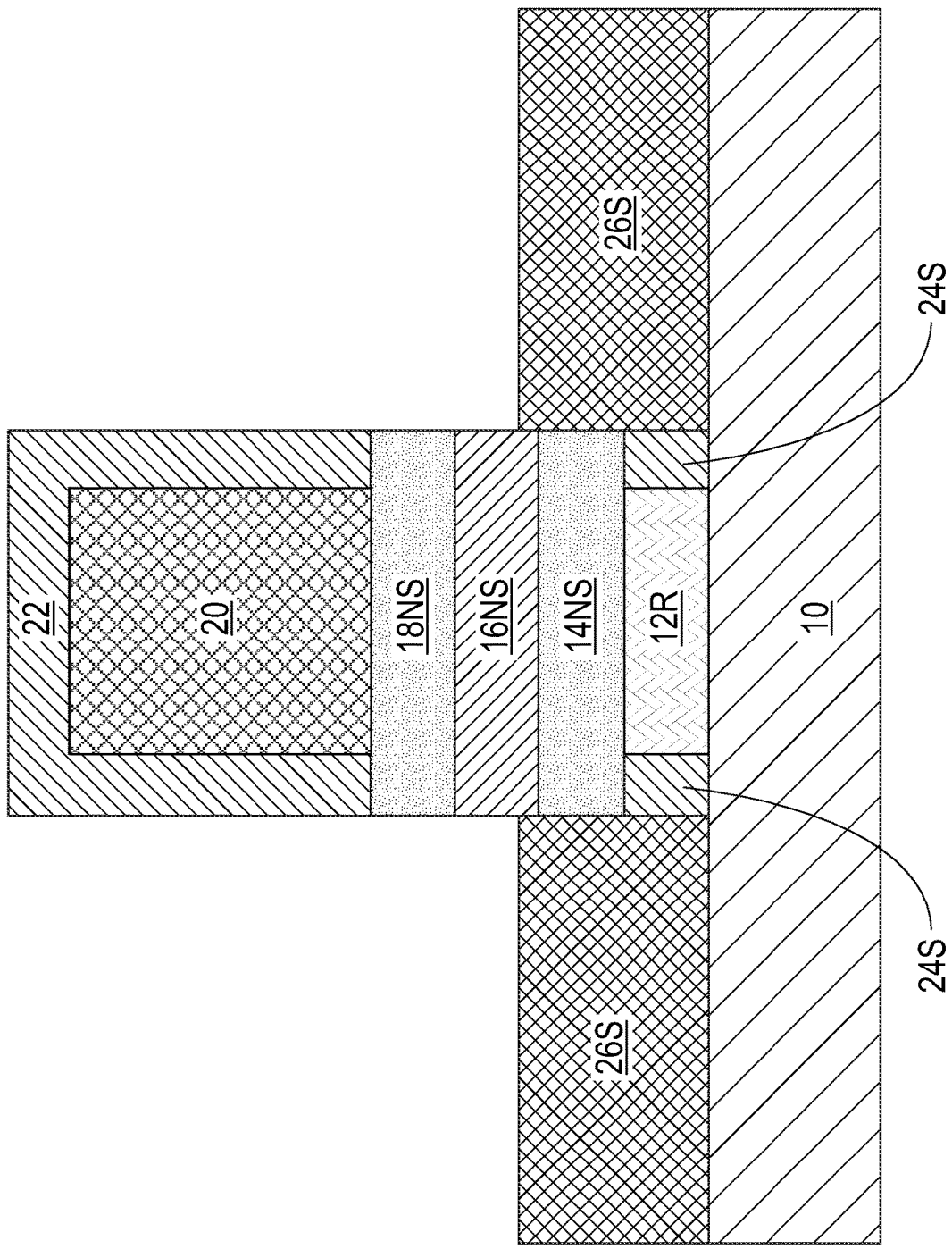
FIG. 5 is a cross sectional view of the exemplary semiconductor structure of FIG. 4 after forming a first source/drain structure on each side of the nanosheet material stack.

Referring now to FIG. 5, there is illustrated the exemplary semiconductor structure of FIG. 4 after forming a first source/drain structure 26S on each side of the nanosheet material stack and from a physically exposed sidewall of the first silicon channel material nanosheet 14NS. The first source/drain structure 26S has a topmost surface that is located between the topmost surface and the bottommost surface of the epitaxial oxide nanosheet 16NS. The first source/drain structure 26S has a bottommost surface that may directly contact the semiconductor substrate 10.

The first source/drain structure 26S can be formed by epitaxial growth of a semiconductor material on physically exposed sidewalls of the first silicon channel material nanosheet 14NS and, optionally, upwards from the semiconductor substrate 10. A recess etch may follow the epitaxial growth of the semiconductor material that provides the first source/drain structure 26S. Prior to the recess etch, the deposited semiconductor material that provides the first source/drain structure 26S may have a faceted upper surface.

The first source/drain structure 26S includes a semiconductor material and a dopant. The semiconductor material that provides first source/drain structure 26S can be selected from one of the semiconductor materials mentioned above for the semiconductor substrate 10. In some embodiments of the present application, the semiconductor material that provides first source/drain structure 26S may be composed of silicon.

The dopant that is present in first source/drain structure 26S can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, the first source/drain structure 26S may have a dopant concentration of from $4 \times 10^{20}$ atoms/cm$^3$ to $3 \times 10^{21}$ atoms/cm$^3$. In one embodiment, the first source/drain structure 26S is composed of phosphorous doped silicon. In such an embodiment, the first silicon channel material nanosheet 14NS will be used as the channel of an n-type FET (or nFET for short).

In one embodiment, the dopant that can be present in the first source/drain structure 26S can be introduced into the precursor gas that provides the first source/drain structure 26S. In another embodiment, the dopant can be introduced into an intrinsic semiconductor layer by utilizing one of ion implantation or gas phase doping.

Figure 6:
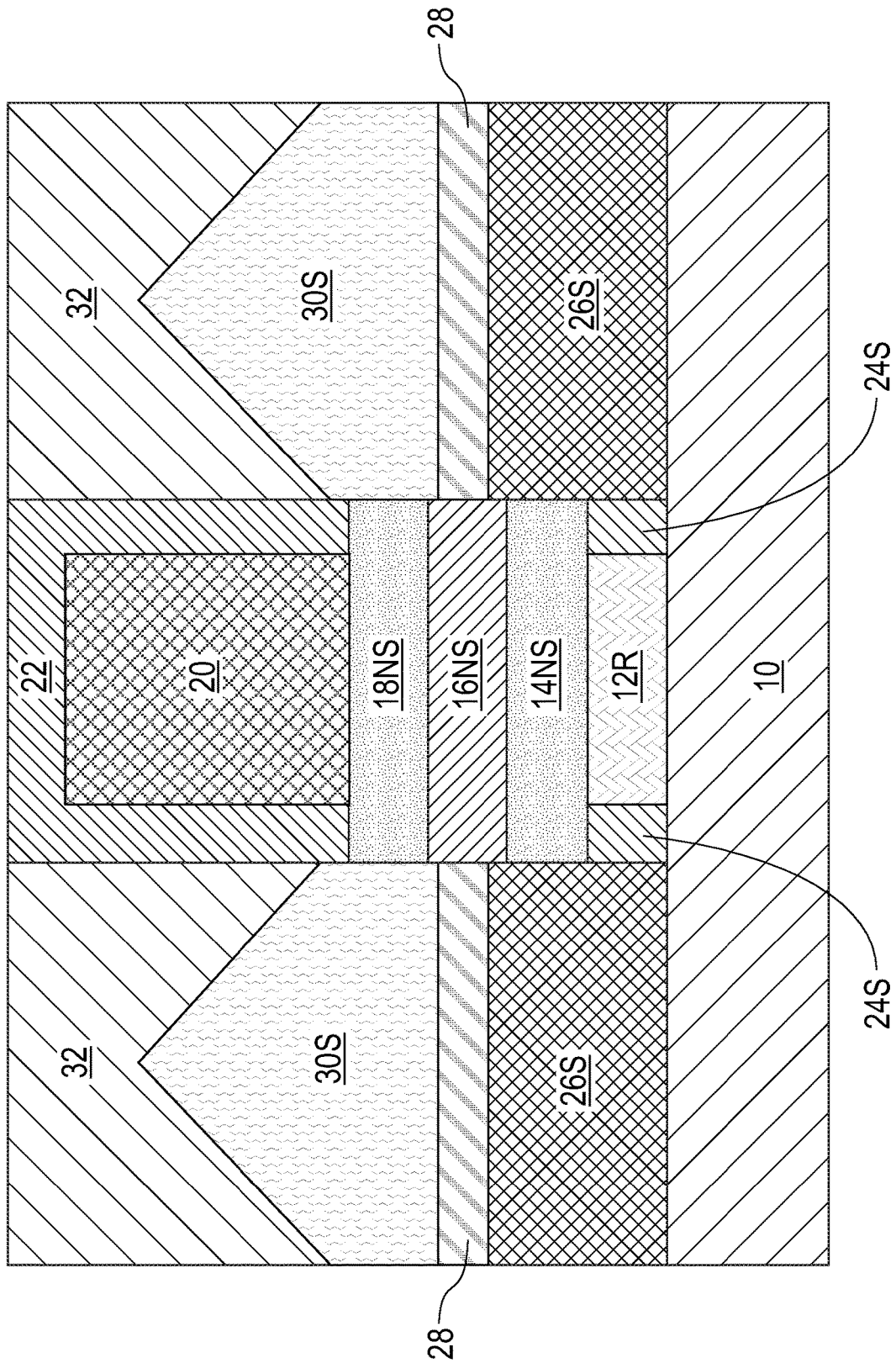
FIG. 6 is a cross sectional view of the exemplary semiconductor structure of FIG. 5 after forming a dielectric material layer on the first source/drain structure, forming a second source/drain structure on dielectric material layer, and forming an interlayer dielectric (ILD) material layer of the second source/drain structure.

Referring now to FIG. 6, there is illustrated the exemplary semiconductor structure of FIG. 5 after forming a dielectric material layer 28 on the first source/drain structure 26S, forming a second source/drain structure 30S on dielectric material layer 28, and forming an interlayer dielectric (ILD) material layer 32 of the second source/drain structure 30S.

The dielectric material layer 28 may include any dielectric material such as, for example, silicon dioxide, that can be formed by a thermal oxidation process or by a deposition process such as, for example, chemical vapor deposition (CVD) or plasma enhanced chemical vapor deposition. A recess etch may follow the thermal oxidation or deposition process. The dielectric material layer 28 has a bottommost surface that is in direct physical contact with a topmost surface of the first source/drain structure, a sidewall surface that contacts the epitaxial oxide nanosheet 16NS, and a topmost surface that is located beneath, or coplanar with, the bottommost surface of the second silicon channel material nanosheet 18NS.

The second source/drain structure 30S is formed utilizing an epitaxial growth process. The second source/drain structure 30S is formed on, and outward from, the physically exposed sidewall of the second silicon channel material nanosheet 18NS. The second source/drain structure 30S may have a faceted upper surface.

The second source/drain structure 30S includes a semiconductor material and a dopant. The semiconductor material that provides second source/drain structure 30S can be selected from one of the semiconductor materials mentioned above for the semiconductor substrate 10. In some embodiments of the present application, the semiconductor material that provides second source/drain structure 30S may be composed of a silicon germanium alloy.

The dopant that is present in second source/drain structure 30S can be either a p-type dopant or an n-type dopant provided that it has a different conductivity than the dopant that is present in the first source/drain structure 26S. In one example, the second source/drain structure 30S may have a dopant concentration of from $4\times10^{20}$ atoms/cm$^3$ to $3\times10^{21}$ atoms/cm$^3$. In one embodiment, the second source/drain structure 30S is composed of a boron doped silicon germanium alloy. In such an embodiment, the second silicon channel material nanosheet 18NS will be used as the channel of a p-type FET (or pFET for short).

In one embodiment, the dopant that can be present in the second source/drain structure 30S can be introduced into the precursor gas that provides the second source/drain structure 30S. In another embodiment, the dopant can be introduced into an intrinsic semiconductor layer by utilizing one of ion implantation or gas phase doping.

The interlayer dielectric (ILD) material layer 32 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as ILD material layer 32. The use of a self-planarizing dielectric material as the ILD material layer 32 may avoid the need to perform a subsequent planarizing step.

In one embodiment, the ILD material layer 32 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the ILD material layer 32, a planarization process or an etch back process follows the deposition of the dielectric material that provides the ILD material layer 32. As is shown, the ILD material layer 32 has a topmost surface that is coplanar with a topmost surface of the dielectric spacer material layer 22.

Figure 7:
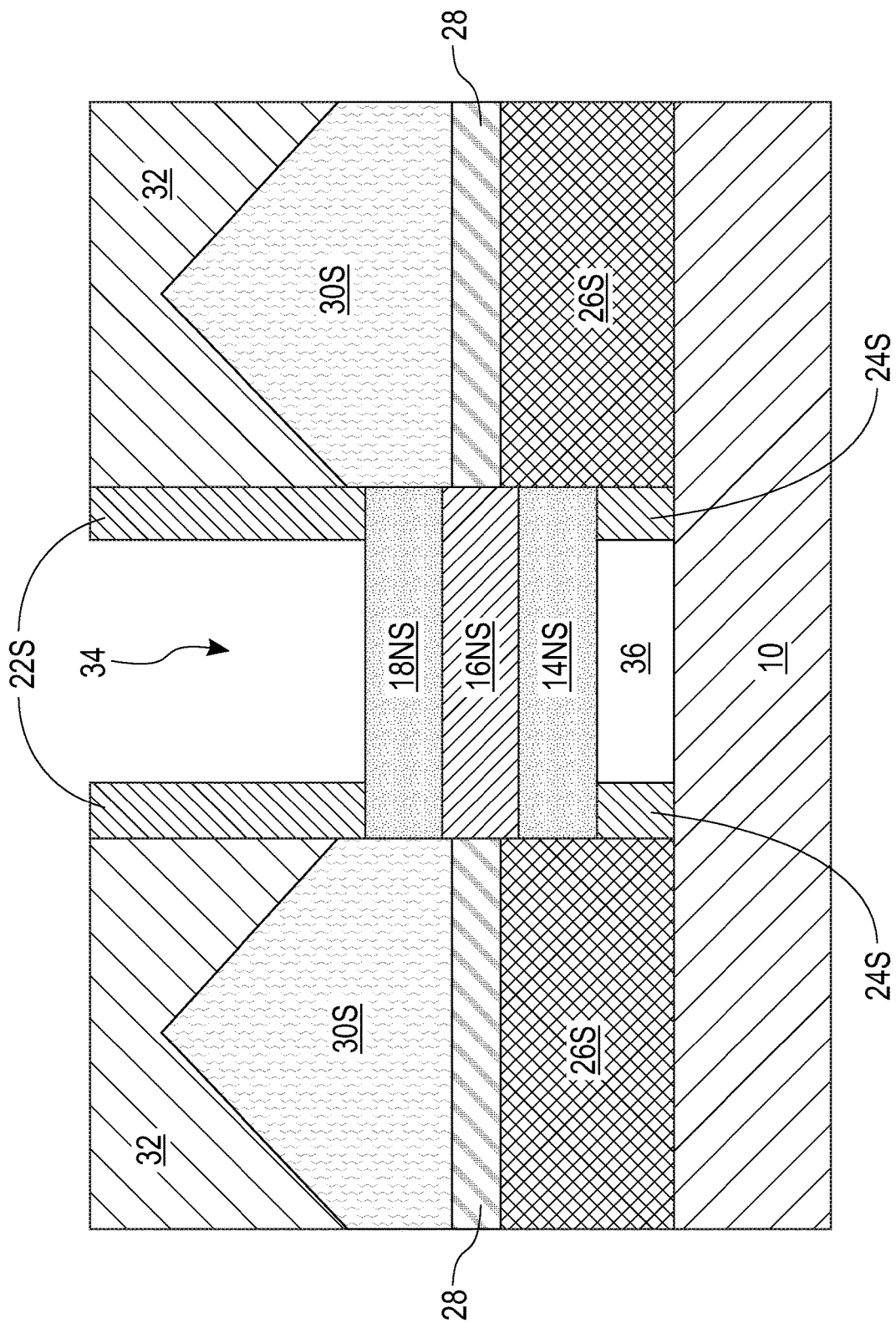
FIG. 7 is a cross sectional view of the exemplary semiconductor structure of FIG. 6 after removing the sacrificial gate structure and the recessed sacrificial semiconductor material nanosheet.

Referring now to FIG. 7, there is illustrated the exemplary semiconductor structure of FIG. 6 after removing the sacrificial gate structure 20 and the recessed sacrificial semiconductor material nanosheet 12R to provide a gate cavity having an upper gate cavity portion 34 and a lower gate cavity portion 36. Prior to removing the sacrificial gate structure 20, a horizontal portion of dielectric spacer material layer 22 is removed from atop the sacrificial gate structure 20 to provide topmost an inner gate spacer 22S. The removal of the horizontal portion of the dielectric spacer material layer 22 and the sacrificial gate structure 20 can be performed utilizing one or more anisotropic etching processes. The recessed sacrificial semiconductor material nanosheet 12R can be removed by utilizing an etching process that is selective in removing the recessed sacrificial semiconductor material nanosheet 12R. After removing the recessed sacrificial semiconductor material nanosheet, the first silicon channel material nanosheet is suspended above the semiconductor substrate 10.

Figure 8:
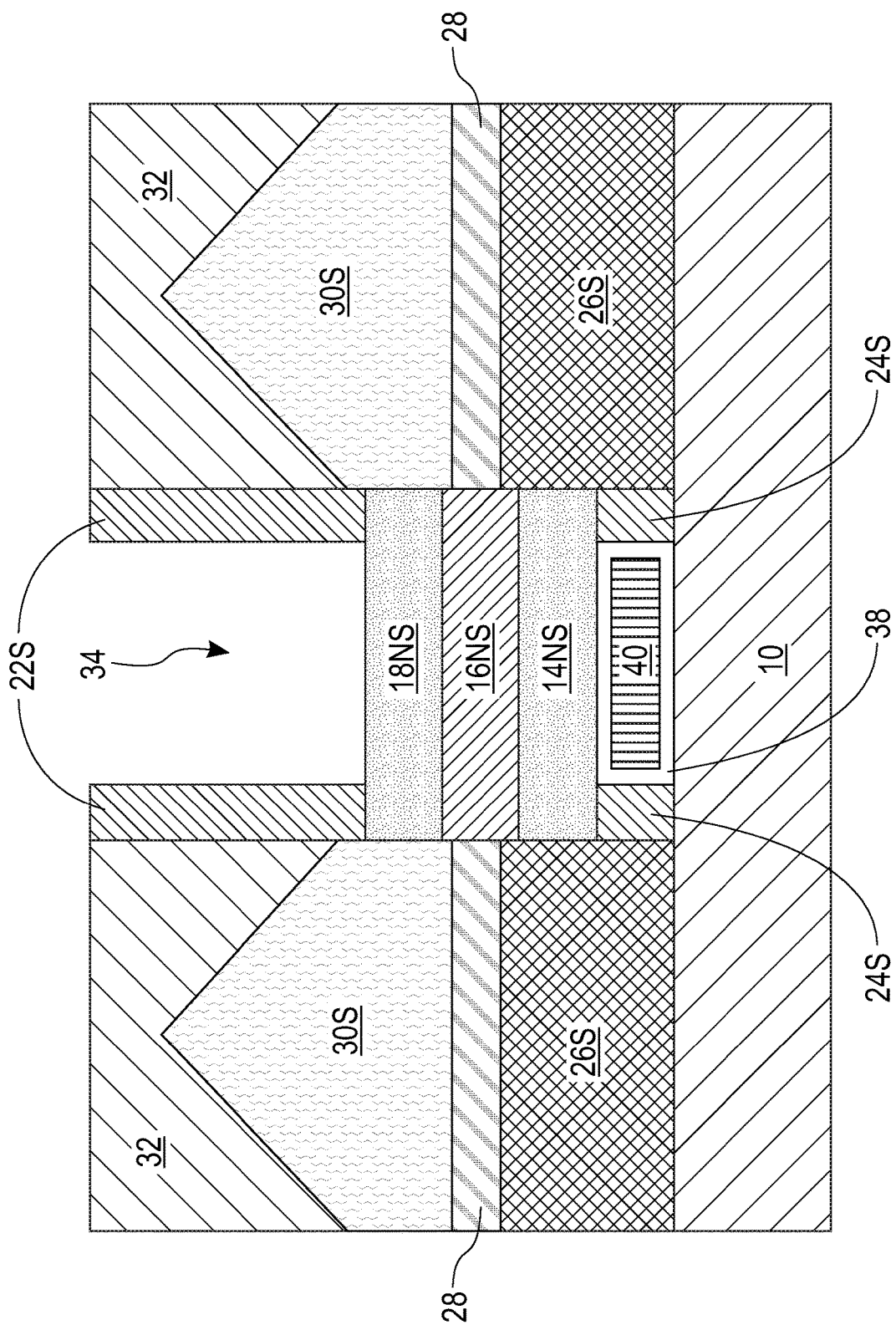
FIG. 8 is a cross sectional view of the exemplary semiconductor structure of FIG. 7 after forming a first functional gate structure of a first conductivity type beneath the first silicon channel material nanosheet and in an area previously including the recessed sacrificial semiconductor material nanosheet.

Referring now to FIG. 8, there is illustrated the exemplary semiconductor structure of FIG. 7 after forming a first functional gate structure (38, 40) of a first conductivity type beneath the first silicon channel material nanosheet 38 and in an area previously including the recessed sacrificial semiconductor material nanosheet 12R (i.e., within the lower gate cavity portion 36). In one embodiment, the first functional gate structure is a p-type FET. By "functional gate structure" it is meant a permanent gate structure used to control output current (i.e., flow of carriers in the channel) of a semiconducting device through electrical or magnetic fields.

The first functional gate structure (38, 40) may include a first gate dielectric portion 38 and a first gate conductor portion 40. The first gate dielectric portion 38 may include a gate dielectric material. The gate dielectric material that provides the first gate dielectric portion 38 can be an oxide, nitride, and/or oxynitride. In one example, the gate dielectric material that provides the first gate dielectric portion 38 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the first gate dielectric portion 38.

The gate dielectric material used in providing the first gate dielectric portion 38 can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material used in providing the first gate dielectric portion 38 can have a thickness in a range from 1 nm to 10 nm. Other thicknesses that are lesser than, or greater than, the aforementioned thickness range can also be employed for the gate dielectric material that may provide the first gate dielectric portion 38.

The first gate conductor portion 40 can include a gate conductor material. The gate conductor material used in providing the first gate conductor portion 40 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In one embodiment, the gate conductor portion 34 may comprise an nFET gate metal. In another embodiment, the first gate conductor portion 40 may comprise a pFET gate metal.

The gate conductor material used in providing the first gate conductor portion 40 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate conductor material used in providing the first gate conductor portion 40 can have a thickness from 50 nm to 200 nm. Other thicknesses that are lesser than, or greater than, the aforementioned thickness range can also be employed for the gate conductor material used in providing the first gate conductor portion 40.

The first functional gate structure (38, 40) can be formed by providing a functional gate material stack of the gate dielectric material, and the gate conductor material. A planarization process may follow the formation of the functional gate material stack, and a recess etch may be used to remove the first functional gate structure (38, 40) from the upper gate cavity portion 34.

Figure 9:
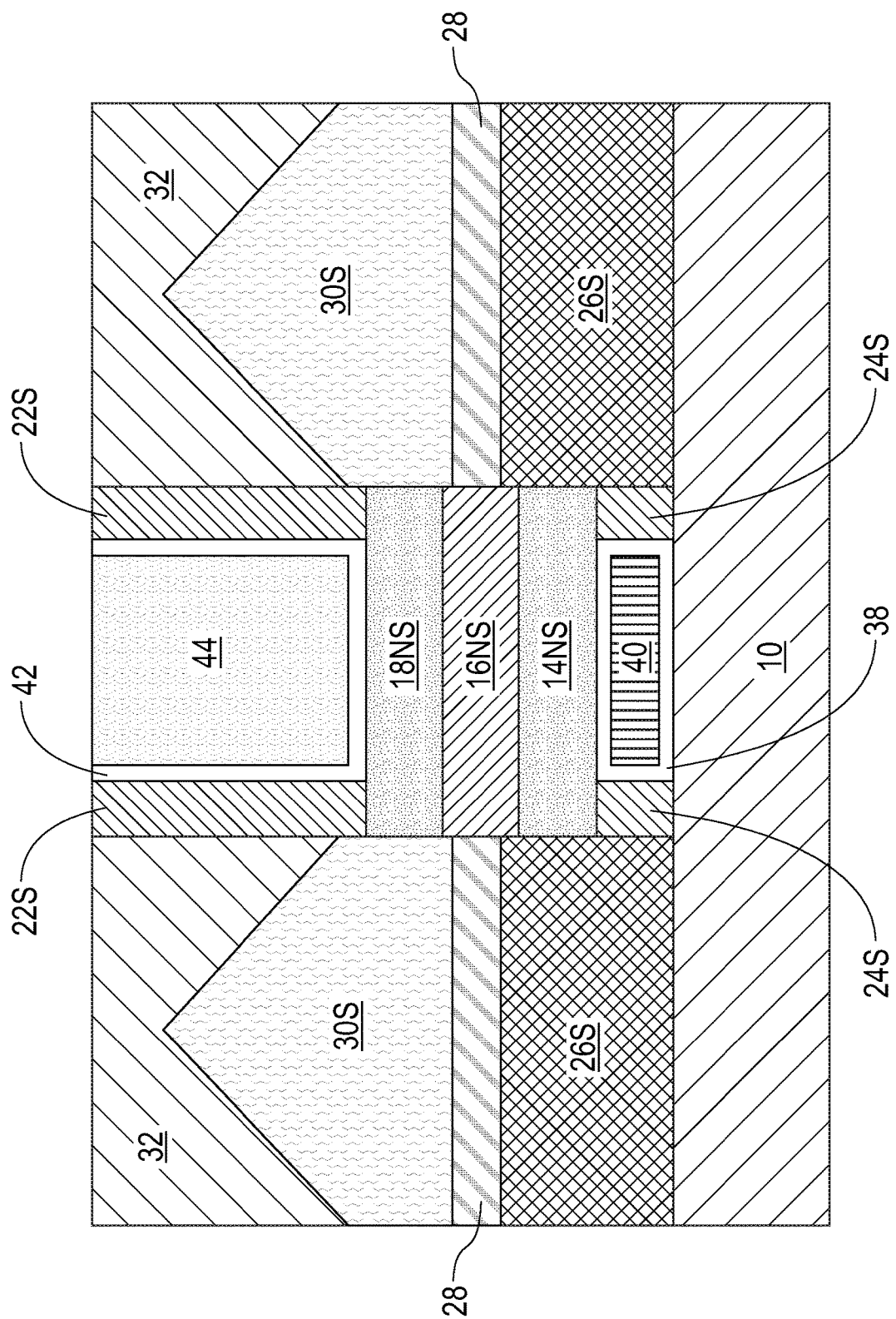
FIG. 9 is a cross sectional view of the exemplary semiconductor structure of FIG. 8 after forming a second functional gate structure of a second conductivity type that is opposite from the first conductivity type above the second silicon channel material nanosheet and in an area previously including the sacrificial gate structure.

Referring now to FIG. 9, there is illustrated the exemplary semiconductor structure of FIG. 8 after forming a second functional gate structure (42, 44) of a second conductivity type that is opposite from the first conductivity type above the second silicon channel material nanosheet 18NS and in an area previously including the sacrificial gate structure 20 (i.e., the upper gate cavity portion 34). The second functional gate structure (42, 44) may include a second gate dielectric portion 42 and a second gate conductor portion 44.

The second gate dielectric portion 42 may include one of the gate dielectric materials mentioned above for the first gate dielectric portion 38. In one embodiment, the second gate dielectric portion 42 may include a same gate dielectric material as the first gate dielectric portion 38. In another embodiment, the second gate dielectric portion 42 may include a different gate dielectric material than the first gate dielectric portion 38. The second gate conductor portion 44 typically includes a different gate conductor material than the first gate conductor portion 40. The second functional gate structure (42, 44) can be formed by deposition of the gate dielectric material and the gate conductor material, and then planarizing the material stack of the deposited gate dielectric material and the gate conductor material such that a second functional gate structure (42, 44) has a topmost surface that is coplanar with a topmost surface of the topmost inner gate spacers 22S and the ILD material layer 32.

FIG. 9 illustrates a semiconductor structure of the present application and including a nanosheet stack comprising an epitaxial oxide nanosheet 16NS sandwiched between a first silicon channel material nanosheet 14NS and a second silicon channel material nanosheet 18NS, and suspended above a semiconductor substrate 10. A first field effect transistor (i.e., the first functional gate structure (38, 40)) of a first conductivity type is located beneath the first silicon channel material nanosheet 14NS, and a second field effect transistor (i.e., the second functional gate structure (42, 44)) of a second conductivity type, opposite the first conductivity type, is located above the second silicon channel material nanosheet 18NS. The exemplary structure of FIG. 9 takes up only one areal device. Thus, there is a density advantage with the exemplary semiconductor structure as compared to other structures in which the pFETs and nFETs are arranged side by side instead of vertically stacked as in the present application. Also, the epitaxial oxide nanosheet 16NS can serve as a charge storage element of the structure. Thus, the exemplary structure may be used as an EPROM device.

Figure 10:
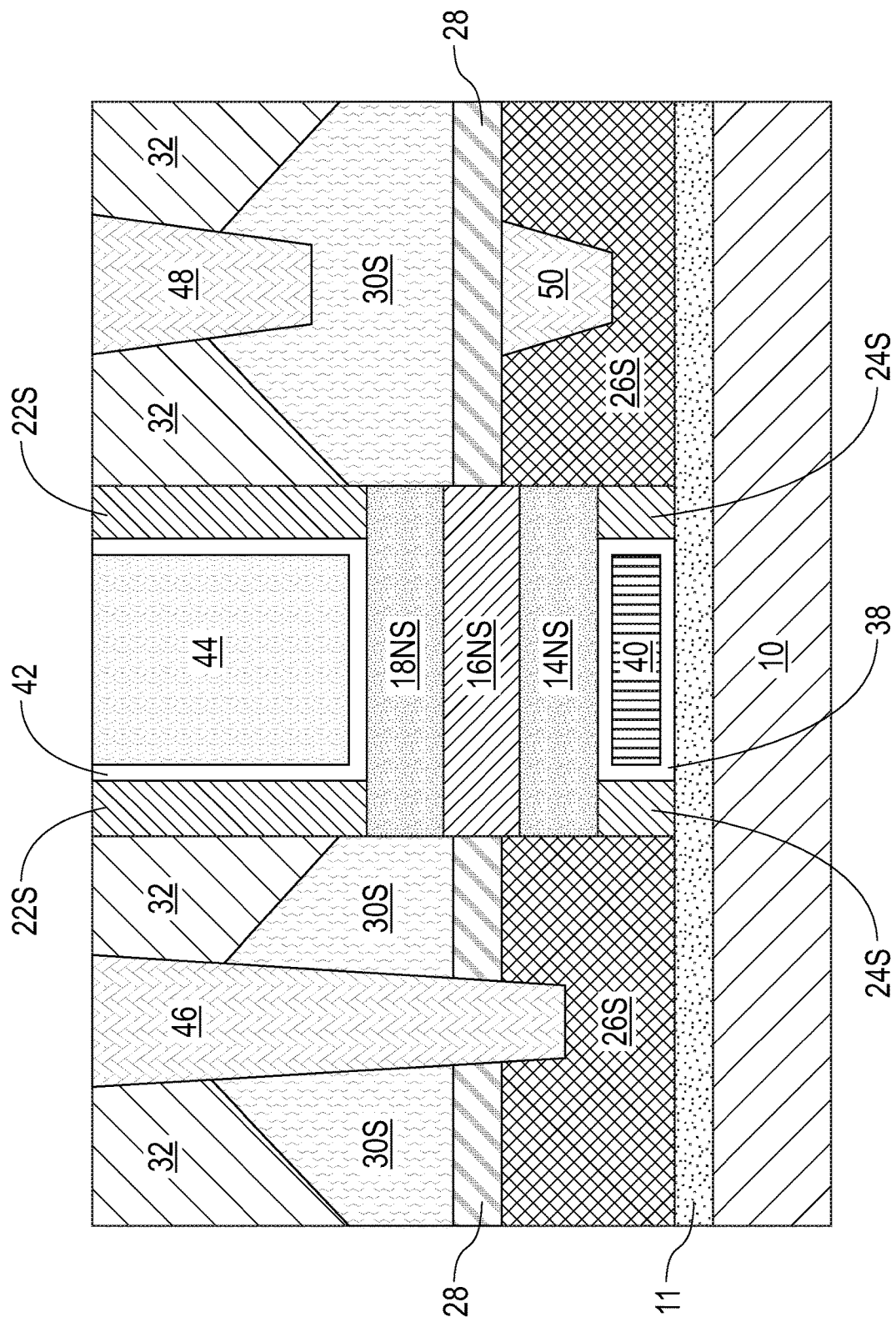
FIG. 10 is a cross sectional view of the exemplary semiconductor structure of FIG. 9 after forming contact structures.

Referring now to FIG. 10, there is illustrated the exemplary semiconductor structure of FIG. 9 after forming contact structures (namely, first source/drain contact structure 46, second source/drain contact structure 48, and a ground contact structure 50). FIG. 10 also shows the presence of a dielectric isolation structure 11 that is formed on, or within, the semiconductor substrate 10. The dielectric isolation structure 11 may include a silicon dioxide layer that is formed after forming the nanosheet stacks 15 utilizing techniques well known to those skilled in the art.

The various contact structures (46, 48, 50) can be formed by first providing contact openings to expose a source/drain structure of the structure. The contact openings can be formed by lithography and etching. Each contact opening is the filled with a contact metal or metal alloy. Examples of contact metals include, but are not limited to, tungsten (W), aluminum (Al), copper (Cu), or cobalt (Co). An example of a contact metal alloy is Cu—Al alloy. A planarization process may follow the filling of each contact opening with the contact metal or metal alloy. The various contact structures (46, 48, 50) are embedded in the ILD material 32.

Figure 11:
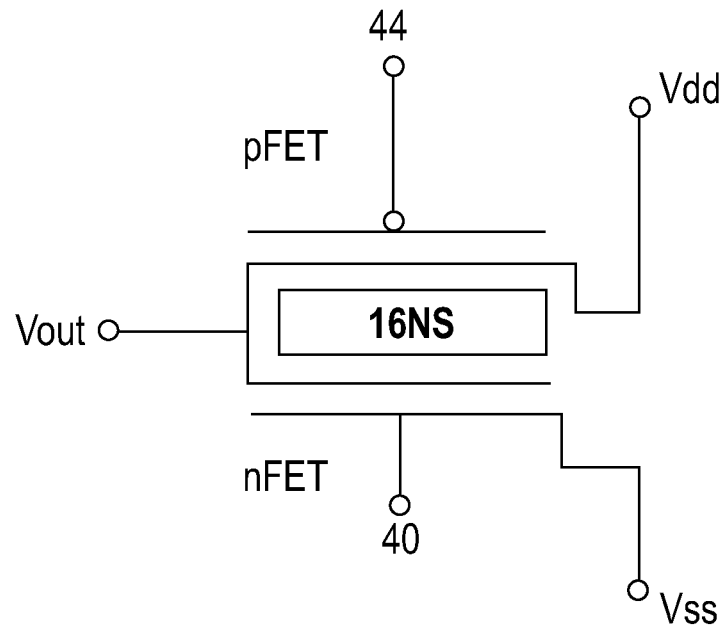
FIG. 11 is a basic circuit schematic of the exemplary structure of the present application.

Referring now to FIG. 11, there is illustrated a basic circuit schematic of the exemplary structure of the present application. In the drawing, a charge storage region, i.e., the epitaxial oxide nanosheet 16NS, is sandwiched between a pFET (i.e., the second functional gate structure (42, 44)) and an nFET (i.e., the first functional gate structure (38, 40)). In this circuit, electrons in the charge storage region, i.e., the epitaxial oxide nanosheet 16NS, turn on the back channel of the pFET, making the pFET behave like a super-low-threshold voltage pFET, and turn off the nFET back channel, making the nFET behave like a super-high-threshold voltage nFET. Efficient hot electrons injection into the charge storage region is accomplished by avalanche hot electron injection using the pFET.

Figure 12:
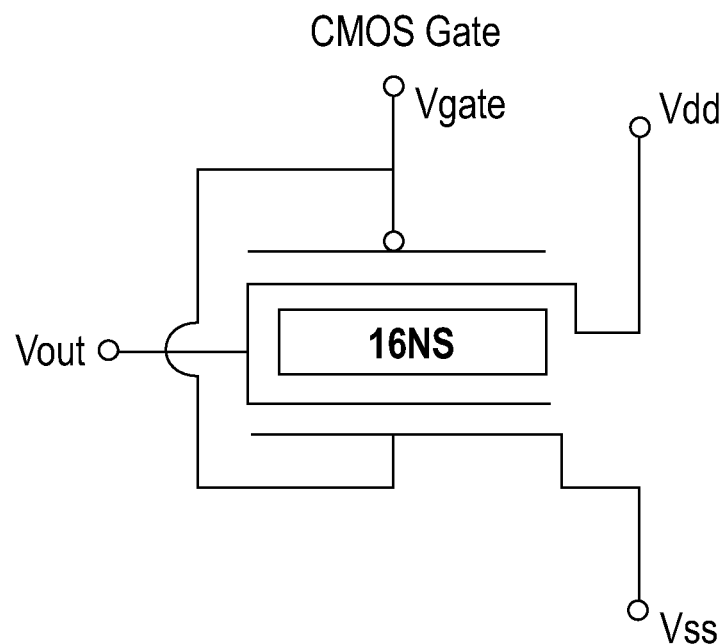
FIG. 12 is a circuit schematic when the exemplary structure of the present application operates as a CMOS inverter.

Referring now to FIG. 12, there is illustrated a circuit schematic when the exemplary structure of the present application operates as a CMOS inverter. In this instance, the exemplary structure operates as a CMOS EPROM. With no electrons in the charge storage region (i.e., the epitaxial oxide nanosheet 16) like a regular CMOS inverter: (i) Vout=Vss when Vgate=Vdd; and (ii) Vout=Vdd when Vgate=Vss.

With a sufficient number of electrons in the charge storage region, the pFET back channel is tuned on, while the nFET threshold voltage is increased. In this instance, (i) Vout approaches Vdd (>>Vdd/2) when Vgate=Vdd; and (ii) Vout=Vdd when Vgate=Vss. Thus, once programmed with hot electron injection, Vout is stuck near Vdd irrespective of Vgate.

Figure 13:
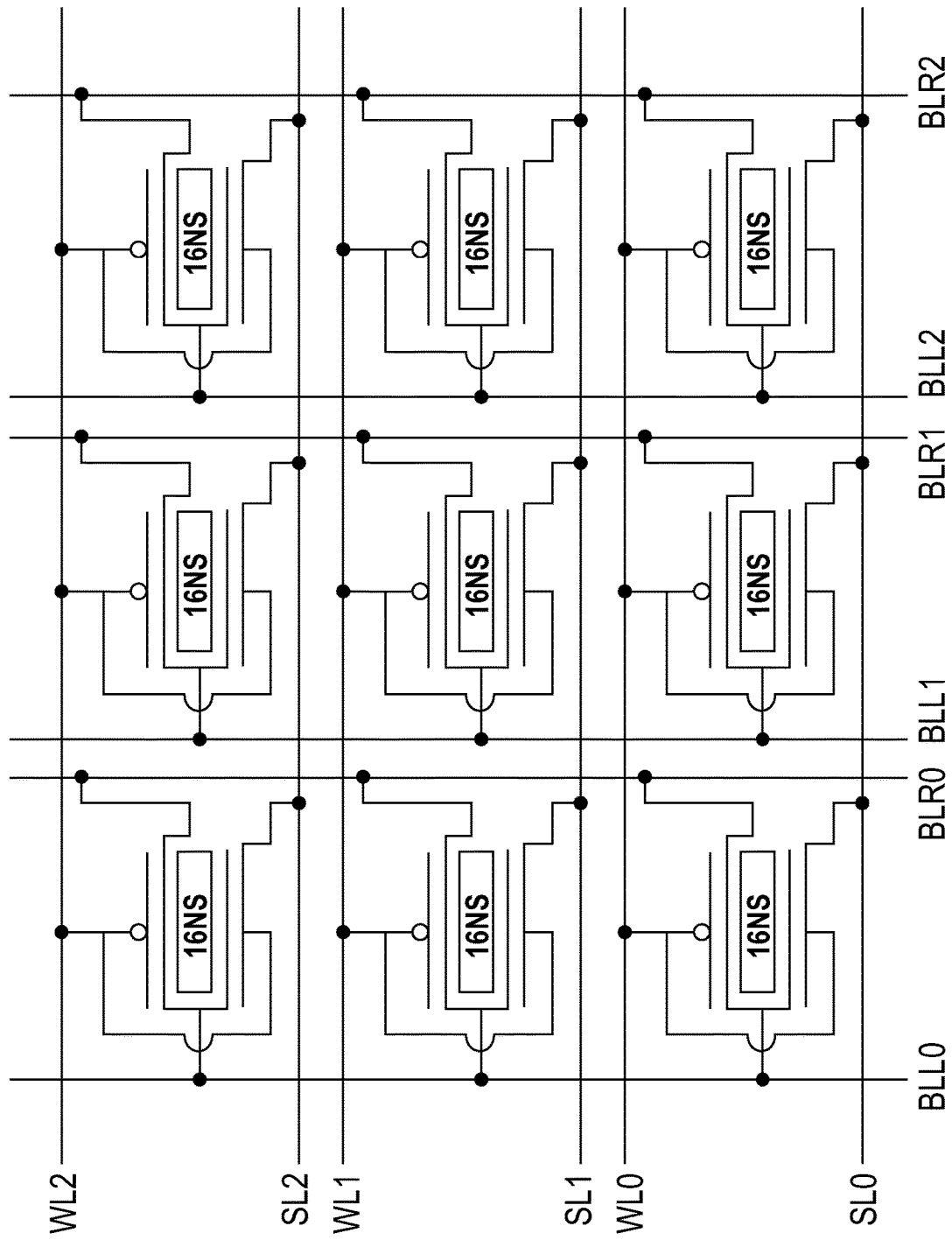
FIG. 13 is a circuit schematic showing a 3×3 CMOS EPROM array including the exemplary structure of the present application.

Referring now to FIG. 13, there is illustrated a circuit schematic showing a 3×3 CMOS EPROM array including the exemplary structure of the present application. In array, the select line (SL) voltage is typically 0 (ground). To program a cell, wordline (WL0) is set a 3 V and the bitline L (BLL0) is set at 0 volts and the bitline R (BLR0) is set a 3V. The nFET is turned on, but there is no current flow in the nFET because BLL0 voltage is zero. The pFET is turned off, and avalanche hot electron injection occurs in the pFET. The larger the voltage of BLR0, the faster the hot electron injection rate. In programming, the non-selected cell has word line voltage of 0. Thus, the non-selected cell has its pFET turned on. Avalanche hot electron in a pFET is much less in a pFET that is on then in a pFET that is off. Hence, a non-selected cell would not be programmed unintentionally.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a nanosheet stack comprising an epitaxial oxide nanosheet sandwiched between a first silicon channel material nanosheet, wherein the nanosheet stack is suspended above a semiconductor substrate, and the epitaxial oxide nanosheet has a first surface that is in direct physical contact with an entirety of a surface of the first silicon channel material nanosheet, and a second surface, which is opposite the first surface, that is in direct physical contact with an entirety of a surface of the second silicon channel material nanosheet;
a first field effect transistor of a first conductivity type located beneath the first silicon channel material nanosheet;
a second field effect transistor of a second conductivity type, opposite the first conductivity type, located above the second silicon channel material nanosheet;
a first source/drain structure located on each side of the nanosheet stack and in direct physical contact with a sidewall of the first silicon channel material nanosheet and a lower portion of a sidewall of the epitaxial oxide nanosheet; and
a second source/drain structure located on each side of the nanosheet stack and in direct physical contact with a sidewall of the second silicon channel material nanosheet and an upper portion of the sidewall of the epitaxial oxide nanosheet.

2. The semiconductor structure of claim 1, wherein electrons are stored in the epitaxial oxide nanosheet.

3. The semiconductor structure of claim 1, wherein the epitaxial oxide nanosheet, the first silicon channel material nanosheet and the second silicon channel material nanosheet are lattice matched.

4. The semiconductor structure of claim 1, wherein the sidewalls of the epitaxial oxide nanosheet are vertically aligned to the sidewalls of both the first silicon channel material nanosheet and the second silicon channel material.

5. The semiconductor structure of claim 1, further comprising an inner spacer surrounding the first field effect transistor and another inner spacer surrounding the second field effect transistor.

6. The semiconductor structure of claim 1, further comprising a dielectric material layer separating the first and second source/drain structures, and directly contacting a middle portion of the sidewall of the epitaxial oxide nanosheet.

7. The semiconductor structure of claim 1, wherein the first conductivity type is n-type and the second conductivity type is p-type.

8. The semiconductor structure of claim 3, wherein the epitaxial oxide nanosheet is composed of lanthanum (II) oxide, gadolinium(III)-oxide, dysprosium(III)-oxide, holmium(III) oxide, erbium (III) oxide, thulium (III) oxide, lutetium(III) oxide, cerium (IV) oxide, lanthanum-yttrium oxide, gadolinium-erbium oxide, neodymium-erbium oxide, neodymium-gadolinium oxide, or lanthanum-erbium oxide.

9. The semiconductor structure of claim 1, further comprising a dielectric isolation structure located on the semiconductor substrate.

* * * * *